United States Patent [19]

Scharfe, Jr.

[11] 4,229,698
[45] Oct. 21, 1980

[54] TUNING INDICATOR

[76] Inventor: James A. Scharfe, Jr., 1960 La France, South Pasadena, Calif. 91030

[21] Appl. No.: 24,264

[22] Filed: Mar. 26, 1979

[51] Int. Cl.² .............................................. H04B 1/16
[52] U.S. Cl. ................................. 375/88; 340/366 R; 455/155
[58] Field of Search ................ 325/455, 320; 324/122, 324/123; 340/753, 754, 366 R

[56] References Cited

U.S. PATENT DOCUMENTS

| | | | |
|---|---|---|---|
| 3,096,400 | 7/1963 | Hutchinson | 178/69 |
| 3,496,410 | 2/1970 | MacIntyre | 315/169 |
| 3,544,990 | 12/1970 | MacIntyre | 340/336 |
| 3,703,630 | 11/1972 | Gelder | 235/151.3 |
| 3,731,203 | 5/1973 | Lieberman | 325/363 |
| 3,745,529 | 7/1973 | Engle | 340/146.1 |
| 3,882,399 | 5/1975 | Karpowycz | 325/455 |
| 3,987,401 | 10/1976 | Irving | 325/455 |

OTHER PUBLICATIONS

"LM 3914 Dot/Bar Display Driver", National Semiconductor, pp. 1–8, Mar. 1978.
"Tuning", RTTY Handbook, pp. 180–196.
"The RTTY Station", RTTY from A to Z, Durward J. Tucker, pp. 187–199.

Primary Examiner—Harold I. Pitts

[57] ABSTRACT

An indicator for displaying RTTY signals in a terminal unit. The terminal unit converts mark and space signals from a radio receiver at audio frequencies to digital pulses for a readout device. Proper tuning of the radio receiver is facilitated by viewing the displayed signals. The readout device converts the digital pulses to alphanumeric characters.

49 Claims, 6 Drawing Figures

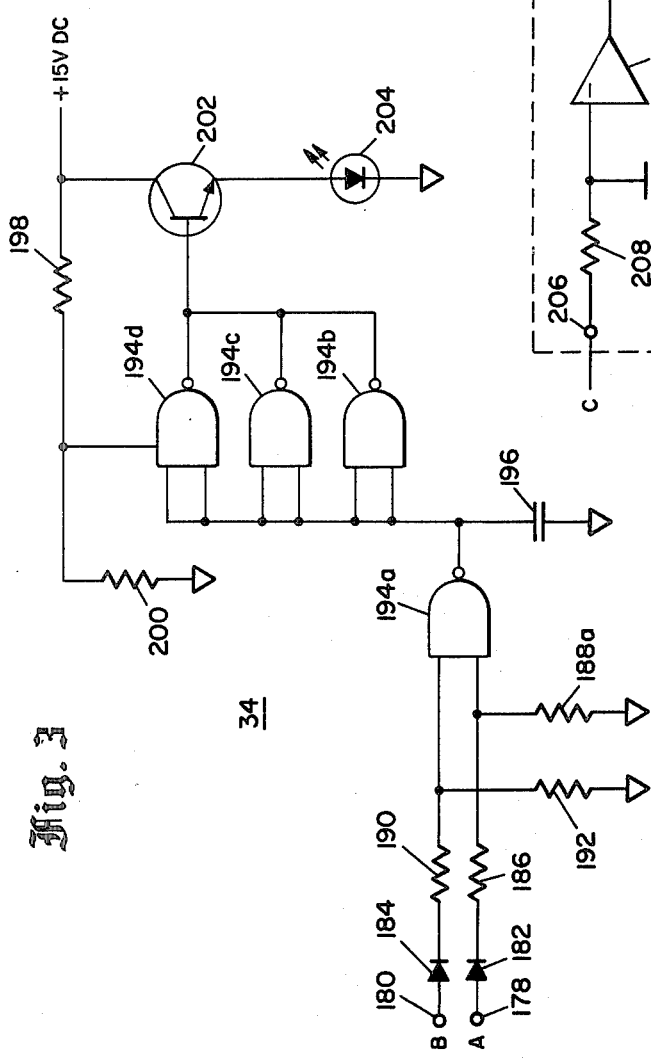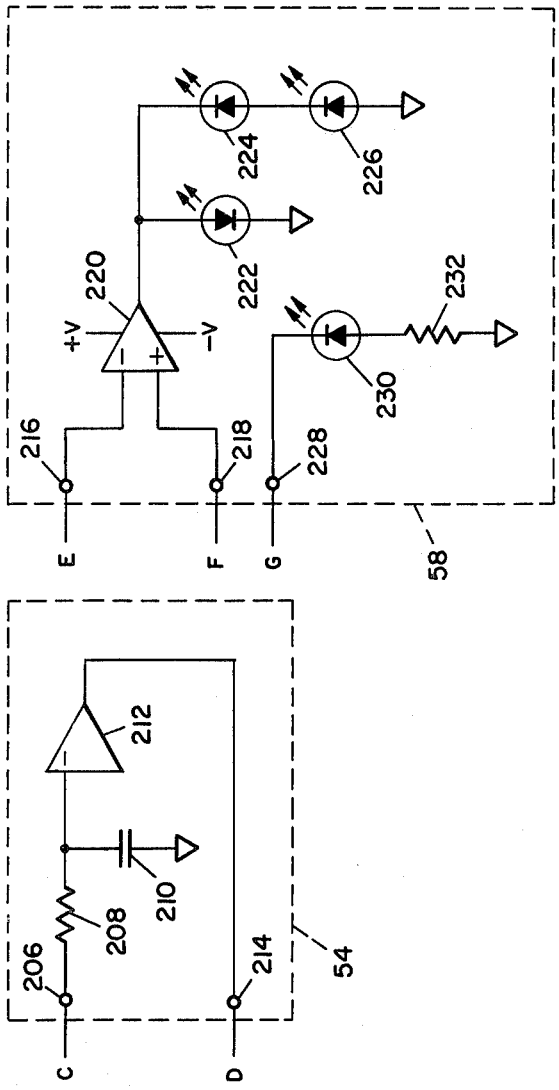

TUNING INDICATOR

FIELD OF THE INVENTION

This invention relates to the art of decoding information signals received via an information transmission channel such as, for example, a radio, telephone or other communicaton circuit between distant points. More particularly the invention relates to a tuning indicator for a terminal unit, also known as a converter, for aid in properly tuning a source of mark and space binary signals such as a radio receiver and for presenting a visual indication of the status of signals received by the terminal unit.

BACKGROUND OF THE INVENTION

The signals used in transmitting information via radio teleprinter channels are an example of complementary series of pulses. These signals are known as "mark" and "space" signals and are complementary because when the mark signal ends, the space signal begins and both the mark and space signals contain the same transmitted information. The radio transmitter emits power during both the mark and space signals but shifts the frequency of the transmitted signal slightly to generate mark and space radio signals at radio frequencies.

A radio receiver produces mark and space signals at two audio frequencies havng a predetermined frequency shift between the mark and the space audio signals. The terminal unit detects information from both the mark and space signals simultaneously.

More particularly, terminal units of the prior art receive mark and space signals from a radio receiver in the form of audio tones at two different frequencies with the mark signals having one frequency such as 2125 Hz and the space signals having another frequency such as 2975 Hz, for example. The mark and space tones are processed in separate channels which include a filter in each channel, with one filter designed to pass only tones at the frequency of the space signals and the other filter designed to pass only tones at the frequency of the mark signals. The tones passed by each filter are then coupled to a detector for demodulating, the tones thus resulting in a series of DC signals. The mark and space signals from the detectors are then summed. The combined signals may be coupled either directly or indirectly to an output device such as a teleprinter or a cathode ray tube for converting the series of DC output signals to a visual presentation of alphanumeric characters to a reader.

In some terminal units of the prior art, lamps are used to indicate the reception of mark and space signals. Such lamps are either on or off and do not provide a real indication of the magnitude of the mark and space signals. They are therefore unsatisfactory for use in tuning a radio receiver to a precise frequency for producing the maximum possible signal level in both the mark and space channels. In other terminal units of the prior art, a cathode ray tube (CRT) is used as the tuning indicator. Conventionally, the mark signal is displayed by the horizontal trace of the cathode ray tube and the space signal by the vertical. Thereby presenting a cross pattern display of the mark and space signals to the operator. Although a cathode ray tube does provide an indication of the instantaneous magnitude of the mark and space signals, it is subject to several disadvantages. The cathode ray tube is becoming scarce and quite expensive to purchase. Further, it requires a high voltage power supply, which includes a number of components and is itself expensive. The cathode ray tube requires a warm-up period after the terminal unit is energized before the tube provides any indication of the mark and space signals. Because the cathode ray tube displays not only the information contained in the mark and space signals but also lines caused by the retrace of the beam of the cathode ray tube, weak signals and signals with a low signal to noise ratio are difficult to properly tune in. These types of signals become lost in the "ball of noise" of the retrace lines.

Also, a cathode ray tube display is difficult for an operator to view and interpret if the operator is more than approximately ten feet from the cathode ray tube. If the radio receiver and terminal unit are installed in a large room, an operator viewing a cathode ray tube indicator may not simply glance across the room to observe the amplitude of the mark and space signals, but must move sufficiently close to the cathode ray tube to do this. Furthermore, the failure rate of cathode ray tubes is rather high compared to other components in a terminal unit. In addition, there is a degradation in the performance of the cathode ray tube with increasing age of the tube or extensive use, because of the duty-cycle, i.e. the tube is normally used to display signals only during a small proportion of the time that it is energized.

SUMMARY OF THE INVENTION

The novel terminal unit of the invention overcomes the above and other disadvantages of terminal units of the prior art by providing a terminal unit having a pair of demodulator channels for detecting the mark and space signals to produce first and second series of pulsating DC signals, a means for combining the first and second series of pulsating DC signals to produce a series of DC output signals for conversions to alphanumeric characters by a readout device, and having a visual indicator of the mark and space signals comprising a dual bargraph display for visually displaying mark and space signals and having a pair of means for generating output signals to selectively energize the discrete display devices in each of the bargraph meters.

More particularly, the dual bargraph meters each comprise a plurality of discrete display devices which emit light when energized with electrical signals such as, for example, light emitting diodes (LEDs). The light emitting diodes are positioned in two rows to form a pair of bargraph meters for visually displaying the mark and space signals to an operator. The means for generating output signals for driving the LEDs of the bargraph meters responds to the mark and space signals by generating an output signal for each one of a plurality of segments of a predetermined range of signal level. Each output signal is generated so long as the magnitude of the input signal to the generating means is within the corresponding segment of a predetermined range of signal level. The segments are preferably selected to be continuous and linear. That is, they extend from the minimum signal level to a maximum without any gap and equal in the proportion of the range of signal level they span. The minimum signal level is selected to be zero for a pulsating DC input signal. In the preferred embodiment of the invention the bargraph meters are "center off" and each display a signal outwardly along the bar in both directions from the center. The two bargraph meters are positioned in the tuning indicator one with respect to the other to form a cross-display. To implement this type of display each output signal from the corresponding output signal generating means is coupled to a pair of LEDs. Each pair of LEDs which are driven, i.e, energized, by the same output signal are positioned in the row of LEDs forming the bargraph meter substantially equidistant from the center of the row. The plurality of LEDs is then energized outwardly in opposite directions from the center of each bargraph meter in response to an increase in the magnitude of an input pulsating DC signals.

The demodulator channels convert mark and space carrier signals having different audio frequencies to mark and space signals having the same third audio frequency. The mark and space signals at the same third audio frequency are then detected. The envelopes of the detected mark and space signals are next summed to produce a series of mark and space DC pulses in a form for driving a readout device such as a teleprinter or a cathode ray terminal.

It is to be understood that the demodulator channels and summing circuit shown in the drawings comprise but one example of a terminal unit incorporating the novel indicator for displaying signals. The indicator may be incorporated at any terminal unit which has the function of converting mark and space audio tones from a radio receiver to a series of DC output pulses for conversion to alphanumeric characters. Also, it should be understood a bargraph meter of discrete display devices wherein pairs of devices equidistant from the center of the bargraph are driven by one output signal for a predetermined range of input signal level is not limited to the application of RTTY terminal units.

The indicator is used to correctly tune a radio receiver so that the number of errors made by a readout device is minimized. The radio receiver must be tuned so that the mark and space signals fall within the passband of its filters. Normally the passband is selected to be only slightly broader than the higher one of the mark and space frequencies in order to reject any undesired signals at frequencies just outside the passband. As the receiver is tuned through an RTTY signal, the magnitude of the mark and space signals displayed on the cross-display will at first be small. When the mark and space signals are properly tuned, the cross-display will have maximum deflection of both bargraph meters. Then, as the receiver is tuned through the signal, the deflection of the bargraph meters will decrease.

Turning now to the more particular aspects of the invention, the novel indicator may be operated in either a dot mode or a bargraph mode. In the dot mode, a pair of light emitting devices are energized by an output signal generating means, preferably an integrated circuit device, so long as the input signal is within a predetermined range. In this type of operation only one pair of light emitting devices is energized at one time. As the input signal increases or decreases, the energized pair of light emitting devices is de-energized and an adjacent pair of light emitting devices is energized, etc. In the bargraph mode of operation, an output signal is generated for each predetermined segment of signal level, so long as the magnitude of the input signal exceeds the lower limit of the segment even though the maximum limit of that predetermined segment is exceeded. Thus, as an input signal increases in magnitude, pairs of light emitting devices substantially equidistant from the center of the bargraph are energized to form a dual bargraph display and would remain energized until the input signal level fell below the minimum level of the corresponding predetermined range of signal levels.

In the preferred embodiment there is an hysterisis or overlap in the segments of the predetermined range of signal level. This produces an overlap in the length of time, output signals are operated for adjacent segments, so that at least one light emitting device is energized whenever a pulsating DC signal is received.

The novel indicator also includes a means for indicating multipath distortion of the mark and space signals. This means indicates the simultaneous presence of mark and space signals and therefore indicates a probable increase in the error rate of the terminal unit. Because the mark and space signals are transmitted as complimentary signals in normal reception there should be no overlap of these signals. Output devices such as teleprinters and cathode ray terminals are designed to generate alphanumeric characters in response to complimentary mark and space signals. An overlap in the signals causes such readout devices to make errors in generating the alphanumeric characters. A flashing indication of an overlap of mark and space signals is very useful to signal the possibility of such errors. Overlap in the mark and space signals is frequently caused by multiple paths of propagation in the radio transmission of mark and space signals from one point on the surface of the earth to another point of reception. High frequency radio signals are reflected by the ionosphere creating multiple paths of different lengths and therefore result in reception of the same signal at different times. The effect is to extend the duration of the mark and space signals, causing an overlap. Some terminal units are equipped with circuitry for preventing errors due to such overlaps caused by multipath distortion.

The indicator also includes a means for indicating the correct reception of a mark RTTY signal. A light emitting device which is energized in the presence of a mark signal is quite useful in tuning a radio receiver used in RTTY applications. The shift in frequency between the mark and the space signals is typically 850 Hz and, in some applications, is as narrow as 50 Hz. Thus a very small change in the radio frequency to which the radio receiver is tuned will greatly affect the amplitude of the mark and space audio tones produced by the radio receiver. This second type of indicator is useful to indicate that both the mark of space signals have been received and then fine tuning may be made by tuning the receiver for maximum deflection of both dual bargraph meters.

A typical tuning condition will illustrate the usefulness of this indicator. If the light emitting device is not illuminated but there is deflection in both axes of the cross-display, then both channels are tuned the same mark or space signal. The operator may then retune the receiver for maximum deflection of both axes of the cross-display and for illumination of the light emitting device.

The means indicating reception of mark signals may also be implemented to operate only if signals of the proper "sense" are received. If mark or space signals are transmitted to a readout device such as the teleprinter or a cathode ray terminal "upside down," the readout device will produce incorrect alphanumeric characters. That is, if the mark and space signals are reversed at the output of the terminal unit with respect to the "sense" of signals to which a readout device will correctly respond, such errors will occur. When the sense of the mark and space is reversed, the light emitting device will not illuminate. The light emitting device of this means is preferably located at the apex of the cross-display of the light emitting devices of the dual bargraph meters.

Mark and space signals are transmitted via radio by frequency shift keying or by audio frequency shift keying. In frequency shift keying, the carrier frequency of the transmitted is used as the mark or space signal and the carrier frequency is shifted or changed slightly to produce the other of the two tones. In audio frequeny shift keying the carrier is modulated with two different audio mark and space tones. The "sense," i.e. whether the mark frequency is higher or lower than the space frequency is not uniform throughout all the countries of the world. Radio waves do not, of course, respect boundaries and signals of opposite sense may be received at one location.

In another typical tuning condition, a continuous marking signal is received but of the wrong "sense" so that this light emitting diode is not illuminated. Returning will not turn it on. The operator may then reverse the "sense" of the mark and space signals by an "upside-down" switch on most terminal units. Retuning of the radio receiver will then produce the desired result of maximum deflection of both axes of the cross-display and illumination of the light emitting device of this means.

The novel indicator also includes a means for indicating the loss (i.e. absence) of the mark and space signals. This third indicating means also incorporates a light emitting device which is energized mutually exclusively with the means for indicating the presence of the mark or space signals.

Indicator 54 also includes an automatic mark hold circuit for holding a teleprinter in mark whenever this indicator circuit senses that there is no mark signal present or whenever it senses a space signal in the space channel which is too long to be a valid space signal. Under either of these conditions a teleprinter used as an output device would run aimlessly and erroneously print alphanumeric characters if not held in mark.

Light emitting devices which indicate multipath distortion, signal loss and an indication of the status of the external teletype loop are located in the four quadrants of the cross-display formed by the dual bargraph meters to form a centralized display for the convenience of the operator.

The novel tuning indicator of the invention overcomes the disadvantages of tuning indicators used in prior RTTY terminal units. The discrete display devices, such as light emitting diodes, used in the tuning indicator are readily available and are inexpensive to purchase. Also, they require only a low voltage for operation. The light emitting devices require neither a warm-up, nor do they display a retrace as does a cathode ray tube. When a voltage driving the light emitting diode into operation is removed, the light emitted by that diode is instantly turned off. The absence of retrace lines means, of course, that with signals and signals with a low signal to noise ratio are more easily tuned in.

Other advantages are readily apparent. The tuning indicator which incorporates discrete display devices such as light emitting diodes is quite visible and may easily be viewed by an operator even one that is a distance away. Also, the failure rate of light emitting diodes is comparable to the failure rates of other components in a terminal unit, particularly a terminal unit which is manufactured using all solid-state devices. Moreover, there is no degradation in the performance of light emitting diodes with increasing age because these of the duty-cycle in which these devices are operated. The devices are operated only on a 100 percent duty cycle. That is, they are displaying signals all the time that they are energized.

It is an object of the invention to provide an indicator for displaying the magnitude of electrical signals which has a row of light emitting discrete display devices.

It is a further object of the invention to provide an indicator for displaying the magnitude of electrical signals wherein a row of discrete display devices are energized individually and outwardly in opposite directions from the center of the row in response to an increase in the magnitude of an electrical signal.

It is another object of the invention to provide a tuning indicator for display having two rows of discrete display devices each for displaying the magnitude of an electrical signal and positioned substantially orthogonally one with respect to the other to form a cross-display.

It is another object of the invention to provide a tuning indicator for displaying the magnitude of electrical signals wherein said row of discrete display devices comprises a plurality of light emitting diodes.

It is a still further object of the invention to provide a tuning indicator for displaying the magnitude of electrical signals and having a row of light emitting discrete display devices wherein individual ones of the devices are energized and deenergized as the level of electrical signal increases or decreases, respectively, through a corresponding segment of a predetermined range of signal level.

It is an object of the invention to provide a tuning indicator for displaying the magnitude of electrical signals wherein said segments are selected to be continuous throughout a predetermined range of signal level.

It is an object of the invention to provide a runing indicator for displaying the magnitude of electrical signals and wherein each said light emitting device is energized so long as the magnitude of the input signal exceeds the lower limit of said corresponding segment of signal level even if the maximum limit of that segment is also exceeded for energizing the row of display devices in the continuous bargraph meter. It is an object of the invention to provide a terminal unit having a tuning indicator for displaying mark and space signals and a means for visually indicating the simultaneous presence of mark and space signals which means indicates the possibility of errors in converting the mark and space signals through alphanumeric characters due to distortion in the signals caused by multiple paths of radio propagation.

It is an object of the invention to provide an RTTY terminal unit having a tuning indicator for displaying mark and space signals and a means for indicating the correct reception of mark signals.

It is an object of the invention to provide an RTTY terminal unit having a tuning indicator for displaying mark and space signals and a means for indicating the absence of input mark signals on the terminal unit.

BRIEF DESCRIPTION OF THE DRAWINGS

FIG. 3 is a schematic diagram of the means for indicating multipath distortion.

FIG. 4 is a schematic diagram of a means for indicating the reception of mark signals, the means for indicating the loss of these signals and an automatic mark hold current.

FIG. 6 is a block diagram showing an alternate manner of connecting a tuning indicator into a terminal unit.

DESCRIPTION OF THE PREFERRED EMBODIMENT OF THE INVENTION

Figure 1:
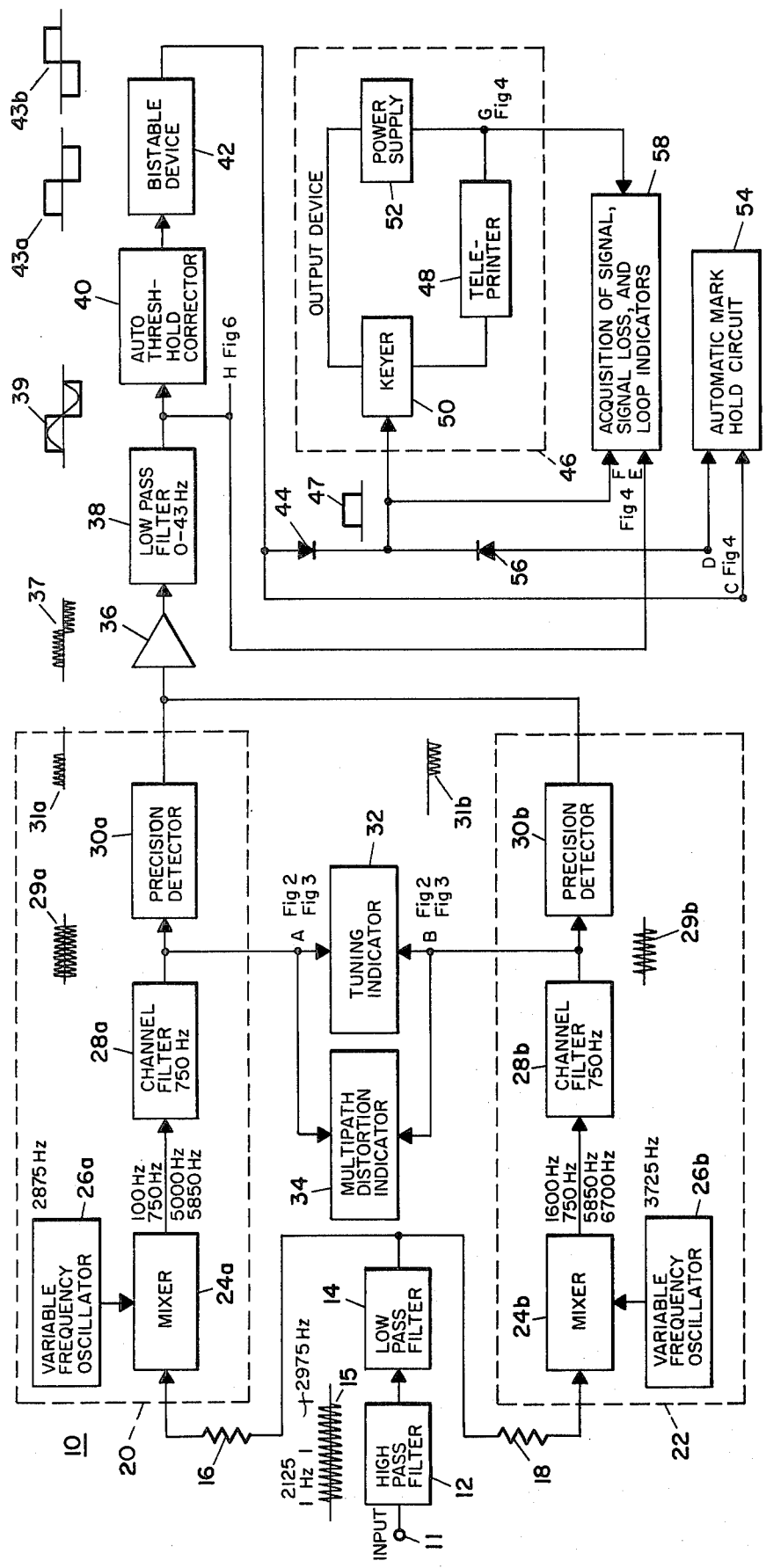
FIG. 1 is the block diagram of an RTTY terminal unit.

There is shown in FIG. 1 a block diagram of a terminal unit which incorporates the novel tuning indicator of the invention. A terminal unit is used in radio teleprinter services to convert information signals at audio frequencies from a transmission channel to DC pulses for operating an output device such as a teleprinter. The intended application of terminal unit 10 is for conversion of coded teleprinter signals received via a radio transmission and reception channel. Terminal unit 10 normally receives at input terminal 11 a sequence of binary coded audio signals from a radio receiver (not shown). The sequence of signals normally comprises signals at two frequencies which are complementary pulse trains with successive signals alternating from one frequency to the other. Such signal coding is known as a dual or double-on-off system of coding where a signal at one frequency represents an "on" pulse and a signal at another frequency represents an "off" pulse. In radio teleprinter services the higher of two audio frequencies is usually the space signal and the lower of the two frequencies is usually the mark signal. Numerous dual-on-off codes have been devised for transmitting information. In the Murray code commonly used in teleprinter services each letter of the alphabet, number and various symbols are represented by five bits of information of equal duration proceeded by a start pulse and followed by a stop pulse. Each of the five bits is transmitted as a mark of a space signal, the start pulse is transmitted as a space signal and the stop pulse transmitted as a mark signal. The mark and space signals of the code are complementary and each contain the information necessary to identify the transmitted letter, number of symbol. The mark and space signals are complementary in the sense that when a mark signal is being transmitted, the space signal is not, and vice versa. The mark and space signals are detected to produce a sequence of bipolar binary pulses. The bipolar binary pulses are, in turn, decoded to operate an output device such as a printer which reproduces the transmitted information in printed form.

Radio teleprinter communications are described in a publication entitled, "The Teleprinter Handbook," published by The Radio Society of Great Britain, 35 Doughty St., London WC1N2 AE. This handbook will be referred to herein as "The Teleprinter Handbook." It includes a description of signalling theory, of prior art converters, of teleprinters and other related information.

Mark and space signals received by terminal unit 10 are first filtered by high pass filter 12 and then are filtered by low pass filter 14. The purpose of filters 12 and 14 is to permit the mark and space tones to pass but to eliminate second harmonics of these tones and other undesired interfering signals. The three decibel points of the high pass filter 12 and the low pass filter 14 may be selected at two kilohertz and three kilohertz respectively for commonly used mark and space signal tones. As shown in wave form 15, for example, mark and space signals differing by 850 Hz such as 2125 Hertz and 2975 Hertz respectively are in common use. Frequency shifts between the mark and space signal of 170 Hz, 425 Hz or 850 Hz are among the most common frequency shifts in use. Filters 12 and 14 may be omitted if a radio receiver having adequate selectivity is available, i.e. if the radio receiver includes an adequate band pass filter which passes only frequencies in the range of 2–3 Hz.

Filters 12 and 14 neither limit nor clip incoming mark and space signals. Such high pass and low pass filters are well known in the art.

Mark and space signals are coupled from the output of low pass filter 14 through resistors 16 and 18 to 20 and 22 detect the mark and space signals in the incoming sequence of signals to present at their respective outputs direct current signals, i.e. pulses.

High pass filter 12 is preferably an active linear phase RC filter. However, it may be an LC filter. Active RC filters are known in the art. National Semiconductor, 2900 Semiconductor Dr. Santa Clara, Calif. 95051, U.S.A., has published a "Handbook of Linear Integrated Circuit Applications" using both monolithic and hybrid circuits entitled "Linear Applications." A high pass active filter which may be utilized as a linear phase filter is shown in FIG. 26 on page AN 5–10 of this handbook. Reference giving details of the design of such filters are set forth on page AN 5–11 of this handbook.

Mark and space signals, which are audio tones, are coupled from the output of high pass filter 12 to low pass filter 14. Low pass filter 14 may also be an active linear phase RC filter or an LC filter. A low pass active filter is shown in FIG. 25 on page AN 5–10 of the linear applications Handbook reference above.

These linear phase filters are designed for a minimum phase distortion, i.e. for minimum pulse stretching of the pulse input.

Mark and space signal tones present at the output of low pass filter 14 are coupled through resistors 16 and 18 to a pair of virtually identical channels 20 and 22 which detect the envelope of these mark and space signals. Resistors 16 and 18 are a voltage-splitting network and direct both the mark and the space audio tones to channel 20 and to channel 22. Channel 20 detects the envelope of the mark signal tones and channel 22 detects the envelope of the space signal tones. Channels 20 and 22 are separate and identical channels which present separate mark and space output pulses.

Mixers 24a and b in channels 20 and 22, respectively, each comprise a low frequency mixer which produces the sum and the difference of two input frequencies. Mixers 24a and b are identical and are constructed using integrated circuits. A low frequency mixer using integrated circuits is shown on page AN 72–35 of the linear applications Handbook referenced above. Each of the mixers 24a and b is preferably a full wave mixer. It has been found that a full wave mixer has an improved signal to noise ratio characteristic compared to the performance of a half wave mixer.

Variable frequency oscillators 26a and b are tunable audio oscillators. Oscillators 26a and b are identical and may be constructed utilizing integrated circuits. A tunable audio oscillator is shown on pages LB 16-1 and LB 16-2 in the linear applications Handbook referenced above.

Each mixer 24 produces output signals at frequencies comprising the sum of the frequency of oscillators 26 and the frequency of each signal coupled from low pass filter 14 and also produces output signals at frequencies comprising the difference between the frequency of oscillator 26 and the frequency of signals coupled from low pass filter 14. Two audio signal tones of different frequencies will normally be coupled to both mixers 24 from low pass filter 14. Therefore, each mixer 24 will produce signals having four different output frequencies. The oscillator 26a in the mark channel 20 is tuned to a frequency which has a predetermined difference with respect to one of the incoming audio signal tones from low pass filter 14. Assuming that the incoming signal tones comprise mark signal tones at 2125 Hz and space signal tones at 2975 Hz, the variable frequency oscillator 26a will be adjusted to 2875 Hz. Mixer 24a in channel 20 will thus produce a difference signal of 750 Hz plus other undesired output signals. Similarly, oscillator 26b in space channel 22 is adjusted to a frequency having a predetermined difference with respect to the other of the incoming audio tones from low pass filter 14. For a space signal tone of 2975 Hz this oscillator 26b is adjusted to 3725 Hz. Mixer 24b produces an output signal of 750 Hz plus other undesired tones. The frequencies of oscillators 26a and 26b are selected to be above the frequency passed by the filters thus keeping mixer product frequencies and spurious radiations out of the channel filters.

Both mixers 24a and 24b produce output signals having a frequency of 750 Hz plus other output signals. It is to be noted, however, that the output of mixer 24a which has a frequency of 750 Hz is an intermediate signal representative of the mark audio signal tones. The output signal of mixer 24b which also has a frequency of 750 Hz is an intermediate signal representative of the space signal tones. In other words, the incoming mark and space signal tones received by high pass filter 12 have been shifted to the same lower frequency of 750 Hz by mixers 24a and 24b.

Filters 28a and 28b in channels 20 and 22 separate the desired frequencies present in the output signals of mixers 24a and 24b, respectively, by passing only a narrow band pass of frequencies around 750 Hz. In the preferred embodiment, each filter 28 has a band pass of approximately 150 Hz for 75 baud operation. A signal speed of 75 baud is a speed of approximately 100 words per minute for information signals transmitted in the Murray code. A baud is conventionally defined as the shortest signal unit in a signal code and may be expressed as the reciprocal of the time of the shortest signal element in a code. Chapter 1 of the Teleprinter Handbook explains teleprinter signalling and the necessity for taking signal speed into account in designing circuits for teleprinter converters. The 150 Hertz bandwidth of filters 28a and 28b is adequate to pass signals coded in either the five-level Murray code or in the eight-level American Standard Code for Information interchange (ASCII) code used in computer and data processing systems.

Oscillators 26a and b can, of course, by adjusted to produce a wide range of difference frequencies. The output frequencies of oscillators 26a and b may each be adjusted to produce difference signals from mixers 24a and b having a common predetermined frequency, such as for example, 750 Hz, regardless of the particular frequencies of the incoming mark and space information signals.

The frequency of the identical channel filters should be selected below the 3 decibel point of the high pass filter 12 to keep undesired signals from receiver and wide band noise from passing through them. Each filter 28 is a linear phase narrow band pass filter. Filters 28a and 28b are preferably identical and are constructed utilizing integrated circuits. Band pass active filters utilizing integrated circuits are shown on pages AN 72-15 through AN 72-18 in the Linear Applications handbook referenced above. A terminal unit which utilizes active band pass filters for separating mark and space audio tones is described in an article entitled "RTTY Demodulator with good Dynamic Range," published in the December 1973 issue of RTTY Journal, Post Office Box 837, Royal Oak, Mich., U.S.A. Volume 21, No. 10, pages 3-7 and page 20. The band pass filter shown therein utilizes an operational amplifier with an RLC circuit as the feedback impedance. These active filters are known as channel filters as they are designed to pass the mark tones in one filter and space tones in the other filter.

In order to maintain a real time relationship between signals in the mark and space channels 20 and 22, the respective mark and space mixers 26a and b and channel filters 28a and b should present the same time delay amplitude response and progagation characteristics to both the mark and space signals. A simple means to accomplish this is to use two identical filters for the mark and space channel filters 28. Linear phase (Bessel function) filters are utilized to minimize time delay and phase distortion. Linear phase filters are described in Sections 8-24 and 21-8 of the Fifth Edition of a handbook entitled "Reference Data for Radio Engineers" published by Howard W. Sams & Co., Inc., Indianapolis, Inc./Kansas City, Mo./New York City, N.W./U.S.A.

The output signals from channel filter 28a comprise mark signal tones at a frequency of 750 Hz. Similarly, the output signals from channel filter 28b comprise space signal tones at a frequency of 750 Hz. The output signals from channel filter 28a and 28b are coupled to respective precision detectors 30a and 30b, respectively, and to tuning indicator 32 and to multipath distortion indicator 34.

Tuning indicator 32 visually displays the magnitude of the mark and space signal present at the output of precision detector 30a and 30b. The indicator comprises a plurality of discrete display devices which emit light when energized by an electrical signal and circuitry which generates output signals for driving the display devices. In the preferred embodiment the display devices comprise light emitting diodes (LEDs). Pairs of display devices are driven by one output signal. The devices of each pair of which is driven by the same output signal are positioned within a row of the devices substantially equidistant from the center of the row. The pairs of display devices in the row are energized by the circuitry outwardly in opposite directions from the center in response to an increase in the magnitude of the mark or space signal. The circuitry generates a plurality of separate output signals, each one in response to an input mark or space signal, each output signal being generated so long as the magnitude of the mark or space signal is within one of the plurality of corresponding segments of a predetermined range of signal level. More particularly, the mark or space input signal will vary from zero to a maximum signal level. In the example shown, the maximum level of the mark signal is positive and that of the space signal is negative. As the signal increases from zero towards the maximum, a first pair of light emitting devices is energized. As the signal level exceeds the maximum limit of the first segment which is also the minimum limit of the second segment, the first pair of light emitting devices continues to be energized and a second pair is also energized. Thus the display devices are arranged in a center-off bargraph meter. One bargraph meter displays the mark signal and the other the space signal. The two bargraph meters are positioned substantially orthogonally, one with respect to the other, to form a cross-display tuning indicator. The tuning indicator is utilized by an operator in tuning a radio receiver for optimal reception of mark and space signals. A radio receiver (not shown) is tuned to produce maximum deflection of the dual bargraph meters as indicated by the illumination of the maximum number of discrete display devices. The actual number of devices which will be illuminated is, of course, dependent upon the signal strength of the input mark and space signals. Tuning indicator 32 is described in more detail below with regard to FIG. 2.

Multipath distortion indicator 34 indicates the simultaneous presence of mark and space signals and therefore indicates the possibility of errors in converting the mark and space signals to alphanumeric characters due to distortion in the mark and space signals caused by multiple paths of radio propagation. Since the mark and space signals are complimentary, they can only be simultaneously present if one signal overlaps the other in duration. Multipath distortion indicator 34 comprises a discrete display device such as a light emitting diode and a logic circuit for driving it. This indicator is described in more detail below with regard to FIG. 3.

Each one of detectors 30a and b may be any known type of detector for detecting the envelope of incoming information signals, such as a diode detector. Detectors 30a and 30b are precision detectors utilizing integrated circuits. A precision detector may utilize an operational amplifier and a pair of diodes with one diode being connected in the output circuit and one diode in the feedback circuit of the operational amplifier. When the input to the operational amplifier is negative, the output becomes positive and the diode in the output circuitry has a polarity such that it is caused to conduct. Because of the high gain of the operational amplifier only a very small input voltage is needed to overcome the forward voltage drop of the diode. When the input voltage to the operational is positive, the output is negative and the diode in the feedback circuit conducts. When the diode in the feedback circuit is conducting, the diode on the output circuit is cut off. Therefore rectification of the input signal has been accomplished.

A precision detector is described in the above mentioned article in the December 1973 issue of the RTTY Journal and on page LB 8-1 of the linear applications Handbook referenced above.

The output signals of precision detector 30a comprise a series of positive pulsating DC signals corresponding to mark signal tones (waveform 31a). The output signals from precision detector 30b are negative pulsating DC signals corresponding to space signal tones (waveform 31b). The output signals of precision detectors 30a and 30b are coupled to operational amplifier 36. The mark and space signals are summed at the input of this amplifier. A terminal unit wherein mark and space signals are summed at the output of the precicion detectors is but one example of a terminal unit for processing mark and space signals to produce a series of output pulses for driving a readout device. The terminal unit shown by example is not a limitation on the usefulness and application of the tuning indicator and first, second and third indicating means claimed as the invention.

Operational amplifier 36 comprises a conventional linear integrated circuit amplifier utilized for providing gain and for summing signals. It may be a Type 741 operational amplifier made by several manufacturers. Operational amplifiers are described in pages AN 20-1 through AN 20-12 of the linear applications Handbook referenced above. Use of an integrated circuit amplifier for summing two signals avoids losses inherent in other means for combining two signals used in the prior art.

The output signals from operational amplifier 36 (waveform 37) is coupled to low pass filter 38. Low pass filter 38 removes the carrier and noise components present in the pulses. Low pass filters traditionally have been designed with Butterworth characteristics which is a very fast roll off characteristic. For 75 baud and lower data rates these filters were usually set at the theoretical optimum roll off point of 37.5 Hz. A linear phase (Bessell function) filter of the type described above is preferable because it is not subject to the adverse characteristics of unequal group delay, overshoot and transient response as is a Butterworth filter. Sinch a linear phase filter has a much more gradual roll off characterstic, it has been determined that the three decibel roll off point is set at 43 Hz to achieve minimum error rate at a data rate of 75 baud or less. The theory of the use of a low pass filter in radio teleprinter converters is discussed in an article entitled "Filters for RTTY" published in the May 1964 issue of the RTTY Journal.

The output pulses from low pass filter 38 (as shown in waveform 39) are coupled to automatic threshold corrector 40. Automatic threshold corrector 40 is optional and required only if in-band diversity operation is desired. In-band diversity operation is discussed below.

Automatic threshold corrector 40 is used to keep the zero threshold of the next stage of the channel, bistable device 40, "centered" around the maximum and minimum levels of the signals received by these devices.

Automatic threshold corrector 40 is preferably of the "precision" type wherein amplifier continuously drives diodes above their threshold levels. The time constant of the automatic threshold corrector must be carefully chosen for a good trade off between the baud rate and the fade rate that is typically encountered in high frequency radio propagation. By empirical methods this has been determined to be between 150 and 250 milliseconds.

An automatic threshold corrector of the precision type is shown in an article entitled "Variable-RTTY Terminal Unit" published in the November 1973 issue of Ham Radio Magazine, Greenville, N.H., U.S.A. 03048 on page 19.

Threshold correctors are well known in the art of demodulating frequency shift keyed signals. In conventional terminal units the determination of the presence of a mark or a space signal is made by a circuit which decides whether the output of a mark channel filter is greater or less than the output of a space channel filter. The usual means for making such decisions is a circuit which combines the output of a mark channel filter with the output of a space channel filter and then decides which signal is present on the basis of the combined signal. Such a system produces errors when fading occurs on either the mark signals or the space signals. Any decision circuit which has a fixed threshold for determining the existance of the mark or space signal is subject to error when fading occurs on either the mark or the space frequency. When selective fading occurs on either the mark or the space frequency, shifting of the decision threshold approximately half-way between the maximum amplitude peaks of the remaining received signal removes the probability of error because the data transmitted on the mark and space frequencies are complementary. That is, error need not occur unless signals on both frequencies fade completely at the same time.

A theoretical analysis of fading signals disturbed by noise and a description of a demodulator are set forth in an article entitled "Frequency Diversity in the Reception of Selectively Fading Binary Frequency-Modulated Signals" published in the Proc. IEE (London)104B (1957), pages 98.110.

Automatic threshold correction techniques are described in a paper entitled "An Improved Decision Technique for Frequency-Shift Communications Systems" by Elmer Thomas which was published in the Proceedings of the IRE, Volume 48, No. 12, December, 1960. An automatic threshold corrector is disclosed in U.S. Pat. No. 2,999,925. Although an automatic threshold corrector of the type using diodes as disclosed in U.S. Pat. No. 2,999,925 might be utilized, it is preferable to use an automatic threshold corrector of an active type which incorporates an integrated circuit for driving diodes continuously and thus avoiding a problem with the threshold level of diodes.

Positive and negative output pulses from automatic threshold corrector 40 are coupled to bistable device 42.

The series of mark and space signals from bistable device 42 is coupled through diode 44 to output device 46.

Output device 46 includes a teleprinter 48 which is a common device for converting the binary pulses from characters into the printed word, i.e., alphanumeric characters. Of course numerous types of other output devices could be utilized such as a device for converting binary signals into a visual presentation such as a cathode ray terminal, for example.

Diode 44 drives a keyer 50 which may be a simple transistor circuit such as the circuit described on page 1.7 of the Teleprinter Handbook referenced above. Keyer 50 is connected in series in a loop circuit which also includes a teleprinter and a power supply 52. Teleprinter 48 converts coded pulses to the printed word. Keyer 50, teleprinter 48 and power supply 50 are connected in a well known loop circuit where the current in the loop is limited to a maximum of 50 milliamperes. Current is turned on and off in accordance with the make and break keying of keyer 50. Conventionally, current is caused to flow in the loop by a mark pulse and a space is a period of no condition. Teleprinter may be any teleprinter such as, for example, a Teletype Model 28 of a Kleinschmidt 311 for signals coded in a five-level Murray code or a Teletype Model 33 or 35 for signals coded in an eight-level ASCII code. Teleprinters are described in detail in The Teleprinter Handbook referenced above.

There follows a brief summary of the operation of the terminal unit where mark and space information is summed after it is detected. A pulse is received at input 11 of high pass filter 12. The mark portion of the pulse is illustrated by waveform 15 and may have a frequency, for example, of 2125 Hz. The space portion of the signal follows immediately at a frequency of 2975 Hz. Both the mark and the space pulses are directed through filters 12 and 14 to mixer 24a and to 24b. Mixer 24a mixes both the incoming mark and space signals with a signal from variable frequency oscillator 26a having a frequency selected to produce an output mark signal from mixer 24 a having a frequency of 750 Hz. For the example shown, variable frequency oscillator 26a would be adjusted to a frequency of 2875 Hz.

Similarly, mixer 24b mixes the incoming mark and space signals with a signal from variable frequency oscillator 26b to produce a space signal having a frequency of 750 Hz. For the example shown, oscillator 26b would be adjusted to a frequency of 3725 Hz.

Channel filters 28a and 28b eliminate undesired signals and pass only the mark signal at 750 Hz and the space signal at 750 Hz respectively. The mark signal at the output of channel filter 28 is shown by wavefrom 29a and the space signal by waveform 29b. Note that the signals are described as being at the same frequency but that they are displaced in time with respect to one another.

Precision detectors 30a and 30b detect the envelope of each AC signal received. Precision detector 30a produces a positive pulsating DC signal as illustrated by waveform 31b. Note that polarity is a matter of design choice. A switch (not shown) could have been added for inverting the polarity of mark and space pulses. Such switches are commonly used to invert mark and space signals which are sent "upside down," there is where the mark and space frequencies are reversed.

Both the mark pulses and the space pulses from precision detectors 30a and 30b are coupled to operational amplifier 36. The output signal from operational amplifier 36 is a bipolar pulse illustrated by waveform 37. Low pass filter 38 and automatic threshold corrector 48 operate on the pulses in the manner described above. The output signal from automatic threshold corrector 40 is a bipolar DC pulse.

Bistable device 42 is a slicer which shapes the bipolar waveform by swinging from a DC level of one polarity to the other in response to an input signal. The output signal from bistable device 42 is illustrated by waveform 43a. The output signal from bistable device 40a is coupled to the input to keyer 50. Keyer 50 is gated in make and break keying by the output signal from slicer 42. Waveform 47 illustrates the DC current in the teleprinter loop circuit. It is to be understood that the polarity of DC pulses throughout the mark and space channels 20 and 22 are merely a matter of design choice and that pulses in the mark and space channels of the same or opposite polarity, with positive pulses in the space channel and negative pulses in the mark channel, could be selected just as well.

A reversing switch may be included in bistable device 42 to reverse the polarity of incoming mark and space signals which are transmitted with opposite "sense" as explained above.

Bistable device 42 restores the shape of received pulses to square waves. Bistable device 42 operates according to well known logic. The output signal of each is a binary signal in either one binary state or the other and an input voltage exceeding a predetermined threshold will produce a saturated output voltage of one polarity. When the input voltage to a bistable device drops below the threshold value, the output voltage switches to the opposite polarity. Assume a positive input voltage to bistable device 42 produces a positive output voltage. Also assume a negative input voltage to bistable device 42 produces a negative output voltage. Where an integrated circuit is utilized in the construction of bistable device 42, the polarity of the output voltage may be inverted or not with respect to the polarity of the input voltage merely by selecting the inverting or noninverting input terminal of the integrated circuit (waveforms 43a and 43b).

Integrated circuits used as bistable devices in this application may comprise a DC limiter circuit which is also known as a slicer. The above mentioned converter disclosed in the December 1973 issue of the RTTY Journal incorporates a slicer. The Teleprinter Handbook referenced above describes a slicer on page 5.21 and shows a diagram of the slicer on page 5.20.

Instead of a slicer bistable device 42 may comprise a Schmitt trigger device or a squaring amplifier, or the like.

Bistable device 42 produces output signals comprising a sequence of positive mark and space DC pulses as shown in waveform 43.

Automatic mark hold circuit 54 holds teleprinter 48 in mark whenever this circuit senses that there is no mark signal or when it senses a signal in the space channel which is longer in time than a valid space signal could possibly be.

As shown in waveform 43 both mark and space information are presented to automatic mark hold circuit 54 by bistable device 42. The output of automatic mark hold circuit 54 is low unless one of these two conditions exist. If one of these two conditions does exist, the output of the circuit becomes high. A logical high (i.e. a positive voltage) is then applied to keyer 50 through diode 56. Keyer 50 responds to a logical high or positive voltage from diode 56 in the same manner as it does to a logical high or positive voltage from diode 44.

A positive input to keyer 50 causes current to flow in the loop from power supply 52 to teleprinter 48 to keyer 50 and back to power supply 52. Printing of an alphanumerical character occurs when the loop current is interrupted in the proper combination of coded pulses to which teleprinter 48 responds. A logical high at the input of keyer 50 causes continuous current to flow in the loop thus holding teleprinter 48 in the mark condition (i.e. a nonprinting condition). Automatic mark hold circuit 54 is described in more detail below with regard to FIG. 4.

The means for indicating the correct reception of mark or space signals and the means indicating a loss of the mark or space signals are both incorporated in indicator 58. In the preferred embodiment the means indicating the reception of the signal are both implemented to indicate the acquisition of the mark signal and the loss of the mark signal. Mark signals are used as input signals rather than the space signal because indicator 54 also generates an automatic mark hold signal which stops teleprinter 48 from printing when a received signal stays in mark. Indicator 58 includes at least one pair of light emitting devices which are energized mutually exclusively. One light emitting device indicates the acquisition of the mark signal by the terminal unit and the other indicates the loss of the mark signal. Indicator 58 is described in more detail below with regard to FIG. 4.

The acquisition of signal and the signal loss indicators and indicator 58 operate according to the following logic. Whenever there is a mark signal (i.e. a positive signal) present at the output of low pass filter 38 and present at the junction of diodes 44 and 56, the acquisition of signal indicator will be illuminated. When there is no signal at the output of low pass filter 38 and the signal at the junction of diodes 44 and 58 is positive, the signal loss indicator will be illuminated. When the output of low pass filter 38 is low (i.e. a negative voltage as shown in waveform 39) and the voltage at the junction of diodes 44 and 58 is high (i.e. a positive voltage), the signal loss indicator will be illuminated. The first of these three conditions means that a mark signal is present both at the output of low pass filter 38 and at the junction of the diodes. When the second condition exists there is no voltage at the output of low pass filter 38. This condition is sensed by automatic mark hold circuit 54 which presents the positive voltage at the junction through diode 56. In the third condition the logical low at the output of low pass filter 38 will couple to automatic mark hold circuit 54 which in turn will present a positive voltage at the junction of the diodes only if the low input condition continues for a predetermined time which is longer than the duration of a valid space signal. Indicator 58 is described in more detail below.

Figure 2:
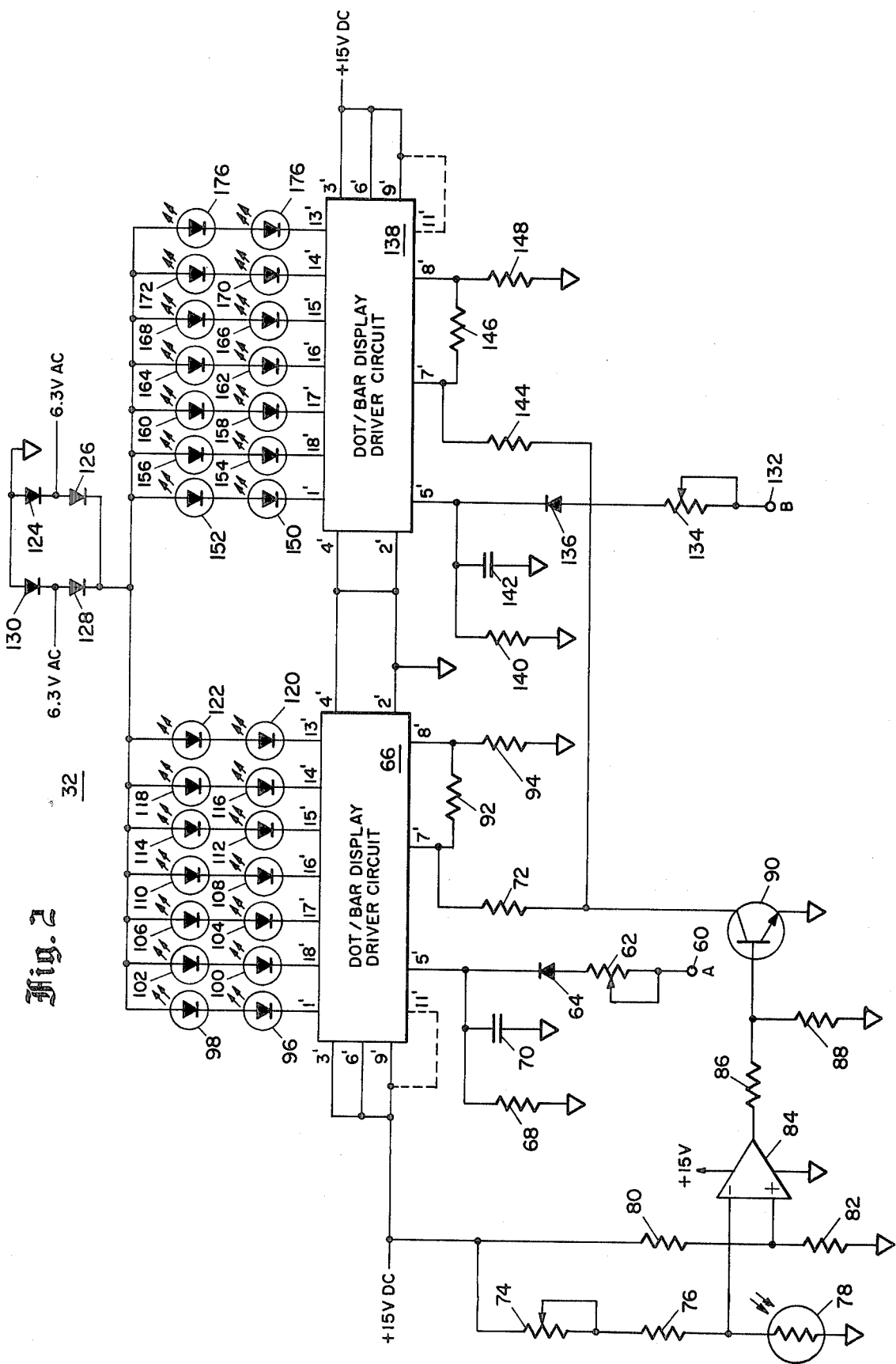
FIG. 2 is the schematic diagram of the light emitting devices of the tuning indicator.

Consider now the detailed circuitry of tuning indicator 32 as shown in FIG. 2. FIG. 2 shows identical circuitry for a pair of bargraph meters for visually displaying the mark and space signals. The circuitry for the mark bargraph meter will be described first and in somewhat greater detail than the circuitry for the space bargraph meter.

Mark signals for driving the mark bargraph meter are received at terminal 60 from the mark channel filter 28a. Variable resistor 62 is adjusted to determine the excursion of the display on the mark bargraph meter for a given input signal level. In other words, the adjustment of variable resistor 62 determines the number of light emitting diodes that will be illuminated for a given input level of the mark signal at terminal 60. The mark signal at the output of variable resistor 62 is bipolar. Diode 64 rectifies the signal and presents a pulsating DC signal to input port 5' of integrated circuit device 66.

Integrated circuit device 66 is a monolithic integrated circuit type LM3914 dot/bar display driver manufactured by National Semiconductor. The circuit such as analog voltage levels and drives up to ten light emitting diodes, thus providing a linear analog display. The primed numbers shown in FIG. 2 are the numbering of the input and output ports as designated by the manufacturer. The circuit has a high input impedance buffer which operates with signals from ground to 12 volts. Input signals are then applied to a series of ten comparators internal to the circuit, each of which is biased to a different comparison level by an internal voltage device network. The voltage divider network is connected to an internal reference voltage. The reference voltage is externally adjusted so that a predetermined range of input signal level is continuously and equally divided into segments. For example, if the reference voltage is selected to the 1.25 volts, for each 125 millivolts that the input signal increases, a comparator will switch on another pair of light emitting diodes. As shown in FIG. 2, only seven output ports are utilized. Although an integrated circuit device is utilized in the embodiment shown in FIG. 2, it is to be understood that the discrete circuitry such as a voltage divider network, comparators and an input buffer or other types of discrete circuitry could be utilized to perfrom this function of dividing a predetermined range of input signal level into a plurality of continuous and equal segments and generating an output signal for each segment.

Resistor 68 and capacitor 70 are connected in parallel between input port 5' of circuit device 66 and ground. Resistor 68 and variable resistor 62 form a voltage divider network for adjusting the input voltage at port 5'. The time constant of resistor 68 and capacitor 70 determines how quickly the light emitting diodes will be energized in response to an input signal at terminal 60. The time constant is selected so that the signals displayed on the bargraph meter move out from the center of the bargraph and fall back in a manner pleasing to the eye of the observer. The brightness of the light emitting diodes is controlled by adjusting the amount of current drawn out of the reference voltage pin 7'. Approximately ten times the current drawn out of pin 7' will be applied to each pair of light emitting diodes controlled by circuit 66. Resistor 68 is connected between pin 7' and a photocell network to perform this function.

The photocell network operates by applying a ground to resistor 72 and removing the ground in response to more or less light received by a photocell. A positive voltage is applied to two parallel voltage divider networks. The first comprises variable resistor 74, resistor 76 and photocell 78. The second network comprises resistor 80 and 82. The junction of resistor 76 and photocell 78 is connected to the inverting input of operational amplifier 84. Similarly, the junction of resistor 80 and resistor 82 is connected to the noninverting input of operational amplifier 84. Amplifier 84 is connected between the positive voltage and ground and therefore its output voltage may be switched between these two voltage levels. When the voltage at the noninverting input is less than the voltage at the inverting input, the output voltage will be zero. When the voltage at the noninverting input is greater than the voltage at the inverting input, the output voltage will be positive. The resistance of photocell 78 varies as a function of the amount of impinging light. Variable resistor 74 is adjusted so that when bright light impinges on photocell 78, the voltage at the noninverting input is greater than the voltage at the inverting input port, thus producing a positive output voltage. The positive output voltage is applied to a voltage divider network comprising resistors 86 and 88. The junction of this voltage divider network is connected to the base of transistor 90. A positive voltage at the base of the transistor causes it to conduct thus grounding resistor 72 and drawing more current from pin 7' of circuit 66. More current drawn from pin 7' wil cause the light emitting diodes to be more brightly illuminated. Conversely, in dimmer light the output signal from amplifier 84 will be zero volts and transistor 80 will be nonconducting thus removing the ground from resistor 72 and decreasing the intensity of the light emitting diodes connected to the output ports of circuit 66.

The internal reference voltage in circuit 66 is adjusted by an external voltage divider network comprising resistors 92 and 94 which are connected between pin 7' and ground. The junction of the two resistors is connected to pin 8'. The divider ratio of resistors 92 and 94 then determines the internal reference voltage. In the embodiment of FIG. 2, resistors 92 and 94 have resistances of 1000 ohms and 7500 ohms, respectively, and the mark input signals at port 5' have a range of approximately 0 to a positive 2 vdc. The resistance values of resistors 92 and 94 are selected in accordance with the manufacturer's application notes.

The dual meters shown in FIG. 2 are connected in the bargraph mode of operation. This is accomplished by connecting pin 9' to a positive supply voltage. To connect the meters in a dot display mode, pin 9' of integrated circuit device 66 would be disconnected from the supply voltage and connected to pin 11', as shown by a dotted line in FIG. 2.

Each output port of integrated circuit device 66 is connected to a pair of light emitting diodes in series. A pair of light emitting diodes is energized whenever integrated circuit 66 controls conduction through an output port to which the diodes are connected in series. A positive voltage is continuously applied to each pair of diodes. More particularly, pin 1' to diodes 96 and 98, pin 18' to diodes 100 and 102, pin 17' to diodes 104 and 106, pin 16' to diodes 108 and 110, pin 15' to diodes 112 and 114, pin 14' to diodes 116 and 118 and pin 13' to diodes 120 and 122. In the application shown output ports 12', 11' and 10' are not utilized. Pin 1' is the output of a comparator at the lower end of the internal voltage divider network and pin 10' is the output port of comparators at the upper end of the voltage divider network. The terms lower and upper mean that the voltage at the lower end of the voltage divider network is less positive than the voltage at the upper end of the network. Thus in the embodiment shown diodes 96 and 98 will be the first pair of diodes to be energized when the input signal is within a segment of a predetermined range of input signal having an approximate minimum voltage level of 0 volts and an approximate maximum level of 200 millivolts. The next pair of diodes to be energized are diodes 100 and 102 where the minimum and maximum voltage levels of the segment are approximately 200 volts and 400 volts, respectively. In the bargraph mode of operation diode 96 and 98 will remain energized when the maximum voltage level of the first segment is exceeded and diodes 100 and 102 are energized. As the input signal at terminal 60 increases in magnitude, additional pairs of light emitting diodes will continue to be energized. Diodes 120 and 122 are the last pair of diodes to be energized when an input signal level exceeds the maximum voltage level of their corresponding segment of a predetermined range of input signal.

The plurality of diodes 96-122 are positioned in a row to form a bargraph meter as described below with regard to FIG. 5.

Diodes 124, 126, 128 and 130 comprise a full wave, bridge rectifier circuit. The bridge rectifies a 6.3 volts AC input voltage to drive the light emitting diodes with a pulsating DC voltage.

Input signals for driving the space bargraph meter are received at terminal 132 from space channel filter 28b. Resistor 134 adjusts the excursion of the display on the space bargraph meter in a manner identical to that of resistor 62 described above. Diode 136 rectifies bipolar space signals from the channel filter to present pulsating DC signals at input port 5' of integrated circuit device 138. Integrated circuit device 138 is identical to integrated circuit device 66 and operates in the same manner as described above. Resistor 140 and capacitor 142 have the same time constant as resistor 68 and capacitor 70 for determining the rate at which the light emitting diodes in the space bargraph will be energized in response to a space signal received at terminal 112. Resistor 144 determines the intensity of the light emitting diodes. Of course, it should be the same value as resistor 72 so the intensity of the mark and the space bargraph meters are substantially identical. The photocell network having its output at switching transistor 90 also controls the amount of current drawn from pin 7' of circuit 138 and therefore controls the intensity of the light emitting diodes comprising the space bargraph meter. Resistors 146 and 148 are voltage divider network for setting the reference voltage to integrated circuit 138. They are identical in function and resistance to resistors 92 and 94, respectively.

The space bargraph meter comprises a plurality of light emitting diodes 150-176. Seven of the ten available output ports of integrated circuit device 138 each control a pair of light emitting diodes connected in series. Specifically, an output signal at port 1' drives diodes 150 and 152, port 18' is connected to diodes 154 and 156, port 17' to diodes 158 and 160, port 16' to diodes 162 and 164, port 15' to diodes 166 and 168, port 14' to diodes 170 and 172, and port 13' to diodes 174 and 176. Output signals at ports 1' 18', 18', 16', 15', 14' and 13' energize corresponding pairs of light emitting diodes by applying a ground in response to an increasing positive mark signal at input port 5' of circuit device 138 in the manner described with respect to integrated circuit device 66.

Next there follows a description of the indicator 34 for indicating simultaneous reception of both mark and space signals as shown in FIG. 3. Mark and space signals are received by this indicating device at terminals 178 and 180 from mark and space channel filters 28a and 28b, respectively. Diodes 182 and 184 rectify the bipolar mark and space signals, respectively. Resistors 186 and 188 are voltage divider network for adjusting the signal level of mark signals at port 8'. Similarly, resistors 190 and 192 comprise a voltage divider network for adjusting the input level of space signals at port 9'. The voltages at the junctions of the two voltage divider networks are applied to the input ports 8' and 9' of NAND gate 194a. In the embodiment shown in FIG. 3, NAND gates 194a, 194b, 194c and 194d are purchased in a convenient and cost effective single unit having four gates. NAND gate 194a produces a low output signal at port 10' when the signals at both of its input ports 8' and 9' are high. The signals at the input ports will both be high only when the mark and space signals from channel filters 28a and 28b overlap in time, i.e., when they are simultaneously present at the input ports. Thus the low signal at the output port 10' of NAND gate 194a is an indication of the simultaneous reception of both mark and space signals. It is therefore an indication of possible multipath distortion to the signals. Capacitor 196 is a filter which prevents reaction to noise spikes. The value of capacitor 196 is selected so that in overlap of approximately ten percent in the mark and space signals is required before the light emitting diodes is energized. Since a low voltage signal is difficult to utilize as a control signal, the remaining NAND gates of the package are connected as parallel inverters to drive a transistor. The output signal at the output port of NAND gate 194a is coupled to the input ports of the remaining NAND gates 194b, 194c, and 194d as shown in FIG. 3. A low signal at each of the six input ports produces a high signal at the output ports. The NAND gates are energized by a positive voltage which is applied to an input port. A voltage divider network comprising resistors 198 and 200 is connected between the supply voltage and ground to produce the proper voltage for energizing the NAND gates. The high output signal at the output ports which indicates an overlap between the mark and space signals is applied to the gate of transistor 202. Transistor 202 and light emitting diode 204 are connected in series between the positive supply voltage and ground. When a high signal is applied to the gate of transistor 202, the transistor conducts and light emitting diode 204 is energized, thus indicating the simultaneous reception of both mark and space signals.

Consider now the automatic mark hold circuit 54 and acquisition of signal and signal loss circuit 58 shown in FIG. 4. Bipolar mark and space signals are received at terminal 206 of automatic mark hold circuit 54. Resistor 208, capacitor 210 and amplifier 212 together comprise a pulse width discriminator circuit. The time constant of resistor 208 and capacitor 210 is selected to be approximately 200 milliseconds which is longer in duration than that of an alphanumeric character in the RTTY code. The longest possible valid space signal is less than the duration of any alphanumeric character because each character ends with a mark stop pulse. The junction of resistor 208 and capacitor 210 is connected to the inverting input of amplifier 212. Positive mark signals keep capacitor 210 charged so that the output of amplifier 212 remains at a logical low unless the signal at terminal 206 ceases for a period greater than approximately 200 milliseconds or the signal at terminal 206 becomes negative for more than approximately 200 milliseconds. Of course, the negative signal would be a signal in the space channel which produces a negative voltage at terminal 206 for a period greater than the validity of any alphanumeric character. Such a signal could be, for example, a CW signal (Morse code) received in the space channel of the terminal unit. The signal at terminal 214 thus comprises an automatic mark hold signal which is coupled to keyer 50 through diode 56 as shown in FIG. 1. The positive mark hold signal causes the keyer to hold teleprinter 48 in the mark condition whenever there is no input signal at terminal 206 or when it is negative for a period greater than approximately 200 milliseconds. Acquisition of signal and signal loss indicator 58 receives signals present at the output of low pass filter 38 at terminal 216 and receives signals present at the junction of diodes 44 and 56 at terminal 218. The signals received at terminals 216 and 218 are coupled to the inverting and noninverting input ports of amplifier 220, respectively. When the signal at the noninverting input port of amplifier 220 is less than the signal at the inverting input port, the output of amplifier 220 will switch to a negative voltage and vice versa. The output port of amplifier 220 is connected to signal loss light emitting diode 222 and to acquisition of signal light emitting diodes 224 and 226. When there is a mark signal (i.e., a positive signal) at the output of low pass filter 28 and a mark or positive signal at the junction of diodes 44 and 56, the output of amplifier 220 will be positive and conduction through light emitting diodes 224 and 226 will cause them to be illuminated. A positive signal can exist at both these points only if a mark signal is received. If there is a positive signal at the junction of diodes 44 and 56 and if there is either a no signal (zero volts) or a space signal (a negative voltage) at the output of the low pass filter 38, the output of amplifier 220 will be negative and conduction through signal loss light emitting diode 222 will cause it to be illuminated. In the latter two conditions the positive signal at the junction of the diodes can only be an output signal from mark hold circuit 54. Thus the illumination of light emitting signal loss light emitting diode 222 is an indication that there is no valid signal to be printed or displayed by an output device.

Another typical tuning condition will again demonstrate the usefulness of the acquisition of signal indicator and signal loss indicators. In tuning a radio receiver to an RTTY signal, an operator may observe maximum deflection of the mark and space bargraph meters and illumination of acquisition of signal indicators 224 and 226 during periods when information is being transmitted. If, however, indicators 224 and 226 are extinguished and signal loss indicator 222 is illuminated during pauses in the transmission of information, this is an indication that there is a reversal in the "sense" of the mark and space signals between the RTTY transmitter. During such pauses the RTTY transmitter is held in the mark frequency. The operator may then reverse the "sense" of the signals presented to an output device by using the reversing switch in bistable device 42 (waveform 43a in FIG. 1).

A loop indicator is also shown in FIG. 4. Terminal 228 is connected to receive the make and break mark and space signals present in the loop shown in output device 46 in FIG. 1. Positive mark signals will cause light emitting diode 230 and resistor 232 to conduct thus energizing the diode. Space signals in the loop are periods of nonconduction. Thus light emitting diode 230 will be energized and deenergized by mark and space signals, respectively.

Figure 5:
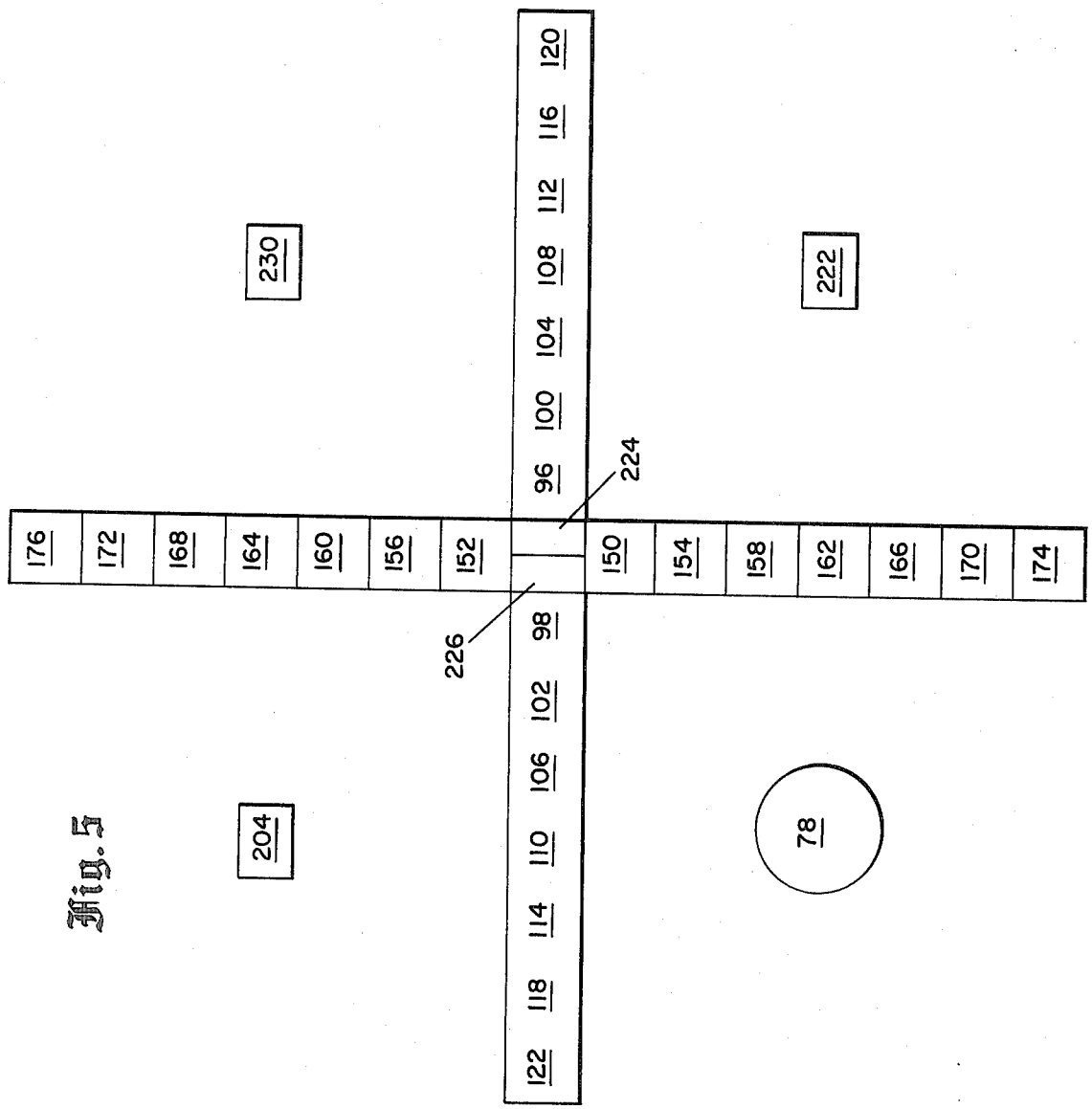
FIG. 5 is a front diagrammatic view of light emitting devices comprising the dual bargraph meters, the light emitting devices for indicating multipath distortion, acquisition of signal and signal loss, and the loop current.

FIG. 5 is a front diagrammatic view of the mark and space dual bargraph meters, the multipath distortion indicator, the acquisition of signal indicator, the signal loss indicator, the loop indicator and a photocell. Light emitting diodes 96–122 and 150–176 are positioned in two rows to form a pair of bargraph meters for visually displaying mark and space signals, respectively. Integrated circuits 66 and 138, as shown in FIG. 2, control the illumination of the light emitting devices in the mark and space bargraph meters, respectively, by generating an output signal for each one of a plurality of segments of a predetermined range of input signal level. Each output signal is generated so long as the magnitude of the input signal to the integrated circuit is within a corresponding segment of a predetermined range of input signal level. The segments are selected to be continuous and linear. The mark bargraph meter comprising diodes 96–122 displays a signal outwardly in both directions from the center of the meter. Similarly the space bargraph meter comprising diodes 150–176 also display a space signal outwardly along the bar in both directions from the center. The two bargraph meters are positioned substantially orthogonally one with respect to the other to form a cross-display. To implement this type of display each output signal from an output port of an integrated circuit is coupled to a pair of light emitting diodes as shown in FIG. 2. Each pair of light emitting diodes which are controlled by the same output signal are positioned in the row or light emitting diodes forming a bargraph meter substantially equidistant from the center of the row. The plurality of light emitting diodes is then energized outwardly in opposite directions from the center of each bargraph meter in response to an increase in the magnitude of an input signal at pin 5' of the controlling integrated circuit. When the input signal decreases in magnitude, the display will collapse inwardly towards the center of the bargraph meter as the input signal decreases through the segments of the predetermined range of input signal levels. There is a hystereisis (i.e. overlap) in the segments of the predetermined range of signal level which is internal to both integrated circuit devices 62 and 118.

Light emitting diodes 224 and 226 which illuminate upon the acquisition of a mark signal are positioned at the center of the cross-display. Two rectangularly shaped diodes may be used for adjusting the size of the acquisition of signal indicator to line up with rectangularly shaped light emitting diodes in the arms of cross-display. Proper tuning of the radio receiver signal providing mark and space signals to a terminal unit result in maximum deflection of the signal in both the mark and space bargraph meters and in illumination of light emitting diodes 224 and 226. The receiver is first tuned for maximum deflection of the signals displayed by the mark and space bargraph meters. That is, for illumination of the maximum number of light emitting diodes in both bargraph meters which the incoming mark and space signals will drive into conduction. If light emitting diodes 224 and 226 are not illuminated, both channels are tuned to the same mark or space signal. Returning of the receiver will then make for maximum deflection of the dual bargraph meters and for illumination of diodes 224 and 226. Signal loss light emitting diode 222 is energized mutually exclusively with acquisition of signal light emitting diodes 224 and 226. When diodes 224 and 226 are extinguished, signal loss light emitting diode 222 will be illuminated.

Multipath distortion indicator light emitting diode 204, loop indicator light emitting diode 230 and photocell 78 are each located in separate quadrants of the cross-display to facilitate viewing by an operator.

Of course, the mark and space bargraph meters could be reversed. Nor need they be vertical and horizontal and of course, they could be parallel or randomly located one with respect to the other. Furthermore, it is within the scope of the invention to utilize a pair of bargraph meters each comprising a plurality of light emitting diodes to display mark and space signals in an RTTY terminal unit wherein each bargraph meter is illuminated in a signal direction from the off or minimum signal position on the meter.

In FIG. 6 there is shown al alternate manner of connecting a tuning indicator to a terminal unit which has an advantage not shown in the embodiment of FIG. 1. A tuning indicator is connected to the output of low pass filter 38 instead of the outputs of channel filters 28a and 28b. More generally, a tuning indicator is connected at a point in the terminal unit after the mark and space signals have been summed. The use of mark and space signals which have been summed as input signals to the tuning indicator produces an additional result. The mark and space bargraph meters of the tuning indicator now also serve as an indication of signal loss when the mark and space channels have been tuned to the same frequency. FIG. 6 shows tuning indicator 234 connected in this alternate manner. The summed mark and space signals are received at terminal 236 from the output of low pass filter 38. Inverter 238 is used to invert the summed mark and space signals. The remainder of the circuitry is identical to tuning indicator 32. Summed mark and space signals are received by tuning indicator 32 at terminal 60 wherein the mark signals have a positive polarity. Summed mark and space signals are received at terminal 132 wherein the space signals are positive. When the mark and space channels of the terminal both receive the same mark or space signal the sum of these two pulsating DC output signals from precision detectors 30a and 30b as shown in FIG. 1 will be zero. Therefore the input signals to tuning indicator 234 will also be zero in this situation and there will be no deflection of the mark and space bargraph meters of the tuning indicator. The acquisition of signal and signal loss portions of indicator 58 will operate as described with regard to FIG. 5. However, the change in the cross-display as viewed by an operator will be much more dramatic. The arms of the cross-display simply go dark when channels 20 and 22 are tuned to a signal having the same frequency. Recall that the terminal unit shown in FIG. 1 is not a fixed channel terminal unit but may be tuned to mark and space tones of different frequencies by adjusting variable frequency oscillators 26a and 26b. Tuning indicator 234 will also provide an operator with an indication that variable oscillators 26a and 26b have both been tuned to a mark or to a space signal from low pass filter 14.

Inverter 238 is utilized only to obtain positive space signals which will be rectified by diode 136 and tuning unit 232 and presented to input port 5' of circuit 138. Circuits 66 and 138 respond only to positive input signals. Of course, circuits 66 and 138 could be implemented in discrete circuitry which would not require inversion of the space signals.

I claim:

1. An indicator for visually displaying a pulsating DC signal comprising:
   means for selectively generating a plurality of separate output signals each in response to the pulsating DC signal, each output signal being generated so long as the magnitude of the pulsating DC signal is within one of a plurality of corresponding segments of a predetermined range of signal level;
   a plurality of discrete display devices which emit light when energized by an electrical signal, said plurality of display devices positioned in a row to form a meter; and
   means for coupling each output signal from said generating means to a pair of said discrete display devices, each said pair of display devices which are driven by the same output signal being positioned in said row substantially equidistant from the center of said row of display devices, said plurality of display devices being energized by said single generating means outwardly in opposite directions from the center of said bargraph meter in response to an increase in the magnitude of said pulsating DC signal.

2. A pair of indicators as claimed in claim 1 for independently displaying a pair of pulsating DC signals wherein the meters of each indicator are positioned substantially orthogonally one with respect to the other to form a cross-display.

3. A device as claimed in claim 1 wherein each said display device comprises a light emitting diode.

4. The device as claimed in claim 1 wherein said generating means comprise an integrated circuit device.

5. The device as claimed in claim 1 wherein said corresponding segments are selected to be continuous throughout said predetermined range of signal level.

6. The device as claimed in claim 5 wherein said predetermined range of signal level is substantially equally divided into said plurality of corresponding segments.

7. The device as claimed in claim 5 wherein said minimum signal level is zero.

8. The device as claimed in claim 1 wherein said meter comprises an illuminated display of dots formed by individual ones of said plurality of discrete display devices.

9. The device as claimed in claim 1 wherein each said output signal is generated so long as the magnitude of the pulsating DC signal exceeds the lower limit of a corresponding segment of signal level even if the maximum limit of that segment is also exceeded for energizing said display devices in a continuous bargraph meter.

10. The device as claimed in claim 1 wherein there is an overlap of said corresponding segments to produce an overlap in the time output signals are generated for adjacent segments so that at least one discrete display device is energized whenever a pulsating DC signal is received.

11. The device as claimed in claim 1 further including means for rectifying an AC signal to produce a pulsating DC signal, said rectifying means connected to said generating means for transmitting said pulsating DC signal.

12. An indicator coupled to an RTTY terminal unit for visually displaying mark and space pulsating DC signals received from an RTTY terminal unit comprising:
   first and second meters comprising first and second pluralities of discrete display devices, respectively, which emit light when energized with an electrical signal, said first and second pluralities of display devices each positioned in a row to form said first and second meters, respectively; and
   first and second means for selectively generating a plurality of separate output signals in response to mark and space pulsating DC signals from said terminal unit, each output signal being generated so long as the magnitude of its input signal is within one of a plurality of corresponding, segments of first and second predetermined ranges of signal level, respectively, output signals from said first and second generating means being coupled to said first and second meters, respectively.

13. The indicator as claimed in claim 12 wherein said first and second meters are positioned substantially orthogonally one with respect to the other to form a cross-display.

14. The indicator as claimed in claim 12 further including first and second means for coupling each output signal from said first and second generating means, respectively, to a pair of discrete display devices in said first and second plurality of display devices, respectively, each said pair of display devices which are driven by the same output signal being positioned in said row substantially equidistant from the center of said row of display devices, each said plurality of display devices being energized by a single generating means outwardly in opposite directions from the center of said meter in response to an increase in the magnitude of a pulsating DC signal.

15. The indicator as claimed in claim 12 wherein each said display device comprises a light emitting diode.

16. The indicator as claimed in claim 12 wherein said first and second generating means each comprise an integrated circuit.

17. The indicator as claimed in claim 12 wherein said corresponding segments are selected to be continuous throughout said predetermined range of signal level.

18. The indicator as claimed in claim 12 wherein said first and second predetermined ranges are each substantially equally divided into said segments.

19. The indicator as claimed in claim 12 wherein said first and second meters each comprise an illuminated display of dots formed by individual ones of said plurality of discrete display devices.

20. The indicator as claimed in claim 12 wherein said first and second generating means generate an output signal for each predetermined range of signal levels so long as the magnitude of the respective input pulsating DC signal exceeds the lower limit of a corresponding segment of signal levels even if the maximum limit of that segment is exceeded to energize the display devices of said first and second meters in continuous, bargraph meters.

21. The indicator as claimed in claim 12 wherein there is an overlap in the corresponding segments to produce an overlap in the time output signals are generated for adjacent segments so that at least one said discrete display device is energized whenever a pulsating DC signal is received.

22. The indicator as claimed in claim 12 further including first means for visually indicating the simultaneous presence of mark and space pulsating DC signals to signal the possibility of errors in converting the mark and space signals to alphanumeric characters due to distortion in the mark and space signals caused by multiple paths of radio propagation.

23. The indicator as claimed in claim 22 wherein said first means includes a light emitting device for indicating the reception of mark and space signals by the RTTY terminal unit.

24. The indicator as claimed in claim 12 further including a second means for indicating the reception of an RTTY signal by the RTTY terminal unit.

25. The indicator as claimed in claim 24 wherein said second indicating means indicates the correct reception of RTTY pulsating DC signals which have the same sense of polarity as predetermined in the RTTY terminal unit for transmitting mark and space signals to an output device and does not indicate the reception of mark or space signals which have the reverse sense.

26. The indicator as claimed in claim 24 further including third means for indicating the absence of an input signal to the RTTY terminal unit.

27. The indicator as claimed in claim 26 wherein said second means includes a first light emitting diode for visually indicating the reception of input mark signals and wherein said third means comprises a second light emitting diode connected in parallel with said first light emitting diode to indicate the absence of input mark signals to the RTTY terminal unit.

28. In a terminal unit for converting mark and space signals from a radio receiver to a series of DC output pulses for further conversion of alphanumeric characters, the improvement comprising first and second meters for visually indicating mark and space signals from said terminal unit, said first and second meters having first and second pluralities of discrete display devices, respectively, which emit light when energized with an electrical signal, said first and second pluralities of display devices each positioned in a row to form first and second bargraph meters for visually displaying the mark and space signals, respectively; and first and second means for selectively generating a plurality of separate output signals in response to mark and space signals from said terminal unit, each output signal being generated so long as the magnitude of its input signal is one of a plurality of corresponding segments of a predetermined range of signal level, output signals from said first and second generating means being coupled to said first and second meters, respectively, to selectively energize said plurality of discrete display devices.

29. The indicator as claimed in claim 28 wherein said first and second meters are positioned substantially orthogonally one with respect to the other to form a cross-display.

30. The indicator as claimed in claim 28 further including first and second means for coupling each output signal from said first and second generating means, respectively, to a pair of discrete display devices in said first and second plurality of display devices, respectively, each said pair of display devices which are driven by the same output signal being positioned in said row substantially equidistant from the center of said row of display devices, each said plurality of display devices being energized by one generating means outwardly in opposite directions from the center of said meter in response to an increase in the magnitude of a pulsating DC signal.

31. The device as claimed in claim 28 wherein each said display device comprises a light emitting diode.

32. The indicator as claimed in claim 28 wherein said first and second generating means each comprise an integrated circuit.

33. The indicator as claimed in claim 28 wherein said corresponding segments are selected to be continuous throughout said predetermined range of signal level.

34. The indicator as claimed in claim 28 wherein said first and second predetermined ranges are each linearly divided into said corresponding segments.

35. The indicator as claimed in claim 28 wherein said first and second meters each comprise an illuminated display of dots formed by individual ones of said plurality of discrete display devices.

36. The indicator as claimed in claim 28 wherein said first and second generating means generate an output signals for each predetermined range of signal levels so long as the magnitude of the respective input pulsating DC signal exceeds the lower unit of a corresponding segment of signal level even if the maximum limit of that segment is exceeded to energize the display devices of said first and second meters in continuous, bargraph meters.

37. The indicator as claimed in claim 28 wherein there is an overlap in the corresponding segments to produce an overlap in the time output signals are generated for adjacent segments so that at least one said discrete display device is energized whenever a pulsating DC signal is received.

38. The indicator as claimed in claim 28 further including first means for visually indciating the simultaneous presence of mark and space pulsating DC signals to signal the possibility of errors in converting the mark and space signals to alphanumeric characters due to distortion in the mark and space signals caused by multiple paths of radio propagation.

39. The indicator as claimed in claim 38 wherein said first means includes a light emitting device for indicating the reception of mark and space signals by the terminal unit.

40. The indicator as claimed in claim 28 further including second means for indicating the reception of a signal by the terminal unit.

41. The indicator as claimed in claim 40 wherein said second indicating means indicates the correct reception of pulsating DC signals which have the same sense of polarity as predetermined in the terminal unit for transmitting mark and space signals to an output device and does not indicate the reception of mark and space signals which have the reverse sense of polarity.

42. The indicator as claimed in claim 41 further including third means for indicating the absence of an input signal to the terminal unit.

43. The indicator as claimed in claim 44 wherein the second means includes a first light emitting diode for visually indicating the reception of input mark signals and wherein said third means comprises a second light emitting diode connected in parallel with said first light emitting diode to indicate the absence of input mark signals to the terminal unit.

44. The indicator as claimed in claim 40 wherein said second means includes an automatic mark hold circuit for holding an output device in a mark condition whenever there is an absence of an input signal or a space signal for at least a predetermined period of time.

45. The indicator as claimed in claim 44 wherein said automatic mark hold circuit includes a pulse width discriminator circuit and a logic circuit for energizing light emitting devices which indicate acquisition of signal and signal loss mutually exclusively.

46. The indicator as claimed in claim 28 further including a fourth means for visually indicating on and off signals driving an output device for converting output signals from the terminal unit to the written word.

47. The indicator as claimed in claim 28 further including means for automatically varying the intensity of light emitted by the plurality of light emitting devices forming said first and second dual bargraph meters as a function of the ambient light impinging on the terminal unit.

48. The indicator as claimed in claim 12 wherein said means for combining said first and second series of pulsating DC signals includes a means for summing said first and second series of pulsating DC signals to produce said series of DC output pulses.

49. The indicator as claimed in claim 8 wherein said first and second meters provide an indication that said first and second demodulator channels are both detecting the same mark or space signal, said first and second generating means generating no output signals in response the the sum of said first and second pulsating DC signals which are both either a mark or a space signal, said first and second meters being in a state of nonillumination in the absence of output signals from said first and second generating means.

* * * * *